(12) United States Patent
Krishnan et al.

(10) Patent No.: US 11,309,202 B2
(45) Date of Patent: Apr. 19, 2022

(54) OVERLAY METROLOGY ON BONDED WAFERS

(71) Applicant: KLA Corporation, Milpitas, CA (US)

(72) Inventors: Shankar Krishnan, Santa Clara, CA (US); David Y. Wang, Milpitas, CA (US); Johannes D. de Veer, Menlo Park, CA (US)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 17/028,878

(22) Filed: Sep. 22, 2020

(65) Prior Publication Data
US 2021/0242060 A1    Aug. 5, 2021

Related U.S. Application Data

(60) Provisional application No. 63/036,834, filed on Jun. 9, 2020, provisional application No. 62/967,957, filed on Jan. 30, 2020.

(51) Int. Cl.
*H01L 21/68* (2006.01)
*G01N 21/21* (2006.01)
(Continued)

(52) U.S. Cl.
CPC .......... *H01L 21/681* (2013.01); *G01B 11/06* (2013.01); *G01N 21/211* (2013.01); *G01N 21/27* (2013.01);
(Continued)

(58) Field of Classification Search
CPC ..................................................... H01L 21/681
(Continued)

(56) References Cited

U.S. PATENT DOCUMENTS

| 5,608,526 A | 3/1997 | Piwonka-Corle et al. |
| 5,859,424 A | 1/1999 | Norton et al. |

(Continued)

FOREIGN PATENT DOCUMENTS

| EP | 3470923 A1 | 4/2019 |
| WO | 2017108411 A1 | 6/2017 |

OTHER PUBLICATIONS

PCT International Search Report and Written Opinion for International Application No. PCT/US2021/014830 dated May 7, 2021, 11 pages.

*Primary Examiner* — Dominic J Bologna
*Assistant Examiner* — Omar H Nixon
(74) *Attorney, Agent, or Firm* — Suiter Swantz pc llo

(57) ABSTRACT

A metrology system for characterizing a sample formed from a first wafer and a second wafer bonded at an interface with a metrology target near the interface may include a metrology tool and a controller. The metrology tool may include one or more illumination sources and an illumination sub-system to direct illumination from the one or more illumination sources to the metrology target, a detector, and a collection sub-system to collect light from the sample. The light collected from the sample may include light from the metrology target and light from a top surface of the first wafer, and the collection sub-system is may direct the light from the metrology target to the detector. The controller may execute program instructions causing the one or more processors to generate estimates of one or more parameters associated with the sample based on data received from the detector.

39 Claims, 10 Drawing Sheets

(51) Int. Cl.
*G01N 21/95* (2006.01)
*G01B 11/06* (2006.01)
*G01N 21/27* (2006.01)

(52) U.S. Cl.
CPC ..... *G01N 21/9501* (2013.01); *G01B 2210/56* (2013.01)

(58) Field of Classification Search
USPC .......................................................... 356/366
See application file for complete search history.

(56) References Cited

U.S. PATENT DOCUMENTS

| | | | |
|---|---|---|---|
| 6,429,943 B1 | 8/2002 | Opsal et al. | |
| 6,985,618 B2 | 1/2006 | Adel et al. | |
| 7,478,019 B2 | 1/2009 | Zangooie et al. | |
| 7,933,026 B2 | 4/2011 | Opsal et al. | |
| 9,291,554 B2 | 3/2016 | Kuznetsov et al. | |
| 9,581,430 B2 | 2/2017 | Manassen et al. | |
| 9,739,702 B2 | 8/2017 | Bringoltz et al. | |
| 9,915,522 B1 | 3/2018 | Jiang et al. | |
| 10,591,406 B2 | 3/2020 | Bringoltz et al. | |
| 10,769,320 B2 | 9/2020 | Kuznetsov et al. | |
| 2002/0135781 A1* | 9/2002 | Singh | G01B 11/26 356/601 |
| 2004/0257571 A1 | 12/2004 | Mieher et al. | |
| 2005/0099678 A1* | 5/2005 | Wang | G02B 5/208 359/359 |
| 2005/0252752 A1* | 11/2005 | Fielden | G03F 7/70916 200/43.04 |
| 2005/0286051 A1 | 12/2005 | Sezginer et al. | |
| 2011/0215442 A1 | 9/2011 | Shneyder et al. | |
| 2014/0172394 A1 | 6/2014 | Kuznetsov et al. | |
| 2017/0287754 A1* | 10/2017 | Nabeth | G03F 7/70633 |
| 2019/0026885 A1* | 1/2019 | Gready | G05B 13/024 |
| 2019/0033211 A1* | 1/2019 | Neil | G01N 21/95623 |
| 2019/0285407 A1* | 9/2019 | Chuang | G01B 11/272 |

* cited by examiner

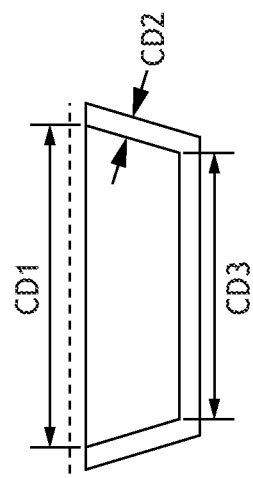
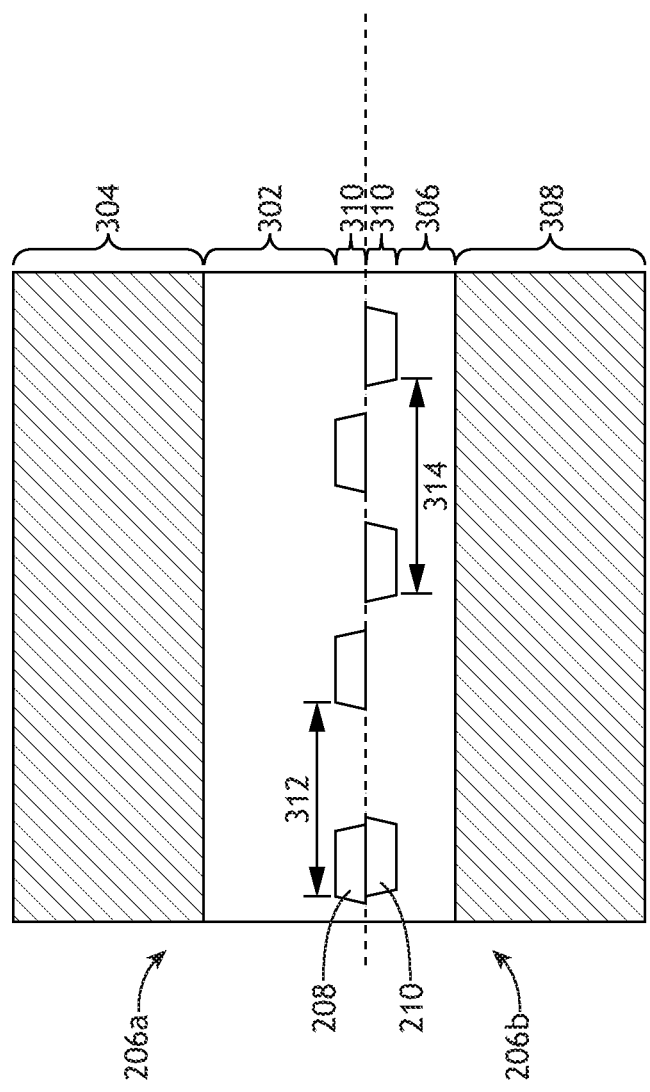

OVERLAY METROLOGY ON BONDED WAFERS

CROSS-REFERENCE TO RELATED APPLICATION

The present application claims the benefit under 35 U.S.C. § 119(e) of U.S. Provisional Application Ser. No. 62/967,957 filed Jan. 30, 2020 and U.S. Provisional Application Ser. No. 63/036,834 filed Jun. 9, 2020, both of which are incorporated herein by reference in the entirety.

TECHNICAL FIELD

The present disclosure relates generally to overlay metrology and, more particularly, to overlay metrology of bonded wafers.

BACKGROUND

Ever-increasing demands on the physical density of semiconductor devices have led to increasingly complex three-dimensional designs. One approach to achieving three-dimensional designs is to fabricate structures on two separate wafers and bond them together with the structures near the interface. This technique may facilitate the integration of complex structures since the two wafers may be fabricated separately and bonded in a subsequent process.

For example, a bonded wafer approach may facilitate the fabrication of high-density three-dimensional memory devices and the corresponding control circuitry. Three-dimensional memory devices typically include a vertical memory structure in which layers of memory cells are stacked and connected by vertical channels. Using traditional single-wafer fabrication techniques, control circuitry for the vertical memory structure may be fabricated beneath or beside the vertical memory structure. However, both approaches have substantial disadvantages: placing control circuitry beneath the vertical memory structure achieves high density at the expense of complexity and cost, while placing control circuitry adjacent to the vertical memory structure achieves low fabrication complexity and the expense of density. In contrast, a bonded wafer fabrication technique may enable the fabrication of the vertical memory structure on one wafer and the control circuitry on another, where the two are integrated together by bonding the two wafers together. Bonded wafer fabrication techniques may be applied to a wide variety of semiconductor devices.

Regardless of the application, bonded wafer fabrication techniques require tight control of the relative alignment, or overlay, of the two wafers. Therefore, it may be desirable to provide systems and methods for accurately measuring overlay of bonded wafers.

SUMMARY

A metrology system is disclosed in accordance with one or more illustrative embodiments of the present disclosure. In one illustrative embodiment, the system includes a metrology tool. In another illustrative embodiment, the metrology tool includes one or more illumination sources. In another illustrative embodiment, the metrology tool includes an illumination sub-system to direct illumination from the one or more illumination sources to a metrology target on a sample at one or more selected incidence angles, where the sample is formed from a first wafer and a second wafer bonded to the first wafer at an interface and where the metrology target is located at the interface. In another illustrative embodiment, the illumination from the one or more illumination sources propagates through the first wafer to reach the metrology target. In another illustrative embodiment, the metrology tool includes a collection sub-system to collect light from the sample, where the light collected from the sample includes light from the metrology target and light from a top surface of the first wafer, and where the collection sub-system directs the light from the metrology target to the detector. In another illustrative embodiment, the system includes a controller communicatively coupled to the collection sub-system. In another illustrative embodiment, the controller generates estimates of one or more parameters associated with the sample based on data received from the detector.

A metrology method is disclosed in accordance with one or more illustrative embodiments of the present disclosure. In one illustrative embodiment, the method includes illuminating a metrology target on a sample with illumination from one or more illumination sources at one or more selected incidence angles, where the sample is formed from a first wafer and a second wafer bonded to the first wafer at an interface, and where the metrology target is located at the interface. In another illustrative embodiment, the illumination from the one or more illumination sources propagates through the first wafer to reach the metrology target. In another illustrative embodiment, the method includes collecting light from the sample in response to the illumination from the one or more illumination sources, where the light collected from the sample includes light from the metrology target and light from a top surface of the first wafer, and where the light from the metrology target is directed to the detector. In another illustrative embodiment, the method includes generating estimates of one or more parameters associated with the sample based on data received from the detector.

A metrology system is disclosed in accordance with one or more illustrative embodiments of the present disclosure. In one illustrative embodiment, the system includes one or more illumination sources. In another illustrative embodiment, the system includes one or more detectors. In another illustrative embodiment, the system includes an ellipsometer to direct, with an ellipsometer illumination sub-system, illumination from the one or more illumination sources to a metrology target on a sample at a first set of one or more selected incidence angles, where the sample is formed from a first wafer and a second wafer bonded to the first wafer at an interface, and where the metrology target is located at the interface. In another illustrative embodiment, the illumination from the one or more illumination sources propagates through the first wafer to reach the metrology target. In another illustrative embodiment, the ellipsometer further directs, with an ellipsometer collection sub-system, light reflected from the metrology target to at least one of the one or more detectors to generate ellipsometry signals. In another illustrative embodiment, the system includes a reflectometer to direct, with a reflectometer illumination sub-system, illumination from the one or more illumination sources to the metrology target at a second set of one or more selected incidence angles. In another illustrative embodiment, the reflectometer is further configured to direct, with a reflectometer collection sub-system, light reflected from the metrology target to at least one of the one or more detectors to generate reflectometry signals. In another illustrative embodiment, the system includes a controller communicatively coupled to the ellipsometer and the reflectometer. In another illustrative embodiment, the controller generates estimates of one or more parameters associated with the sample based on the ellipsometry signals and the reflectometry signals.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures in which:

FIG. 3A is a profile view of an overlay target formed from metallic target elements in accordance with one or more embodiments of the present disclosure.

FIG. 3B is a profile view of an overlay target element of a CD overlay target in accordance with one or more embodiments of the present disclosure.

DETAILED DESCRIPTION

Figure 1A:
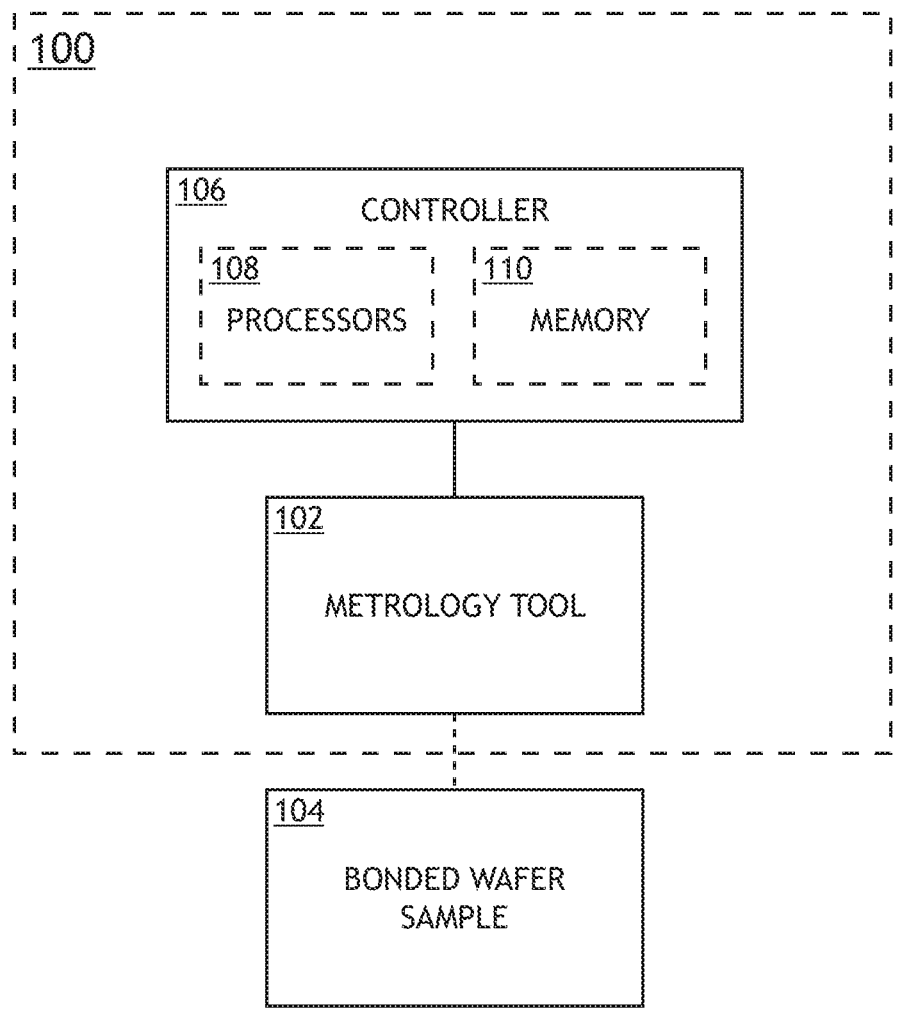
FIG. 1A is a conceptual view illustrating a semiconductor device fabrication system, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to measuring registration errors (e.g., overlay measurements) between bonded wafer samples using ellipsometry and/or reflectometry. An overlay metrology target for measuring registration errors of a bonded wafer sample may be formed at an interface between two bonded wafers, where the overlay target includes periodic structures on one or more layers of each wafer near the interface. In one embodiment, an overlay metrology target at the interface is interrogated by propagating light through one of the wafers to reach the interface and collecting light reflected from the interface that propagates back through the wafer.

As used throughout the present disclosure, the term wafer is intended to broadly refer to a material having a flat surface suitable for bonding with another material. In this regard, the term wafer and sample piece may be used interchangeably. The terms sample and bonded wafer sample may also be used interchangeably. Further, a wafer or sample piece may be formed from any material including semiconductor or non-semiconductor material such as, but not limited to, monocrystalline silicon, gallium arsenide, and indium phosphide. A wafer or sample piece may include one or more layers. For example, such layers may include, but are not limited to, a resist (including a photoresist), a dielectric material, a conductive material, and a semiconductive material. Many different types of such layers are known in the art, and the term sample as used herein is intended to encompass a sample on which all types of such layers may be formed. One or more layers formed on a sample may be patterned or unpatterned. For example, a sample may include a plurality of dies, each having repeatable patterned features. Formation and processing of such layers of material may ultimately result in completed devices. Many different types of devices may be formed on a bonded wafer sample, and the term sample as used herein is intended to encompass a sample on which any type of device known in the art is being fabricated. Further, for the purposes of the present disclosure, the term sample and wafer should be interpreted as interchangeable.

It is contemplated herein that an overlay target at an interface between two bonded wafers may present several challenges for overlay measurements. For example, an optical measurement technique will require that light propagate through one or both of the constituent wafers (referred to herein as top and bottom wafers). Accordingly, the wavelength of light may be limited by the absorption spectrum of the wafers and any other deposited layers. Semiconductor wafers typically absorb ultraviolet and visible light such that overlay measurements may be limited to infrared wavelengths that may propagate through the sample with minimal (or at least acceptable) loss. Additionally, measurements using light of any wavelength may lead to specular reflections and/or scattering at various surfaces (e.g., surfaces of the top and bottom wafers) that may introduce noise to the measurement.

It is further contemplated herein that illumination of a bonded wafer sample with off-axis light (e.g., illumination at oblique angles with respect to a surface normal) may result in a spatial separation of light reflected from different interfaces or surfaces at varying depths in the sample. Accordingly, light from the overlay target at the interface of the two wafers may be separated or otherwise isolated from light associated with reflections from other interfaces or surfaces.

In one embodiment, light from the overlay target at the interface is isolated to increase the accuracy and/or sensitivity of the overlay measurement. For example, collection optics of a metrology system may include one or more cylindrical lenses to separate light reflected from an overlay target at the interface from light reflected from other surfaces including, but not limited to, top or bottom surfaces of the bonded wafer sample.

It is further contemplated herein that overlay measurements may be based on any type of ellipsometry or reflectometry technique including, but not limited to, spectroscopic ellipsometry or reflectometry with one or more illumination angles, single-wavelength ellipsometry or reflectometry, angle-resolved ellipsometry or reflectometry, or Mueller matrix-based techniques.

Referring now to FIGS. 1 through 7, systems and methods for overlay measurements of a bonded wafer sample are disclosed in accordance with one or more embodiments of the present disclosure.

FIG. 1A is a conceptual view illustrating a semiconductor device fabrication system 100, in accordance with one or more embodiments of the present disclosure. In one embodiment, the system 100 includes a metrology tool 102 configured to characterize one or more properties of a bonded wafer sample 104. In another embodiment, the system 100 includes a controller 106 communicatively coupled to the metrology tool 102. In another embodiment, the controller 106 includes one or more processors 108 configured to execute program instructions maintained on a memory medium 110, or memory. The one or more processors 108 of a controller 106 may include any processing element known in the art. In this sense, the one or more processors 108 may include any microprocessor-type device configured to execute algorithms and/or instructions. Further, the memory medium 110 may include any storage medium known in the art suitable for storing program instructions executable by the associated one or more processors 108. For example, the memory medium 110 may include a non-transitory memory medium. As an additional example, the memory medium 110 may include, but is not limited to, a read-only memory (ROM), a random-access memory (RAM), a magnetic or optical memory device (e.g., disk), a magnetic tape, a solid-state drive and the like. It is further noted that memory medium 110 may be housed in a common controller housing with the one or more processors 108.

In this regard, the one or more processors 108 of the controller 106 may execute any of the various process steps described throughout the present disclosure. For example, the one or more processors 108 of controller 106 may receive data from the metrology tool 102 (e.g., from a detector within the metrology tool 102) and generate estimates (e.g., measurements) of one or more parameters associated with the bonded wafer samples 104. The estimates of the one or more parameters may include estimates of any parameter or property of a bonded wafer sample 104 or a portion thereof. For instance, the processors 108 may generate estimates of the overlay, or overlay error, between two wafers of a bonded wafer sample 104. In another instance, the processors 108 may receive, generate and/or implement an electromagnetic analyzer (EMA) analysis of multilayer film stacks in a bonded wafer sample 104 to generate estimates of properties of one or more layers of the film stacks such as, but not limited to, thickness, composition, or refractive index.

Figure 1B:
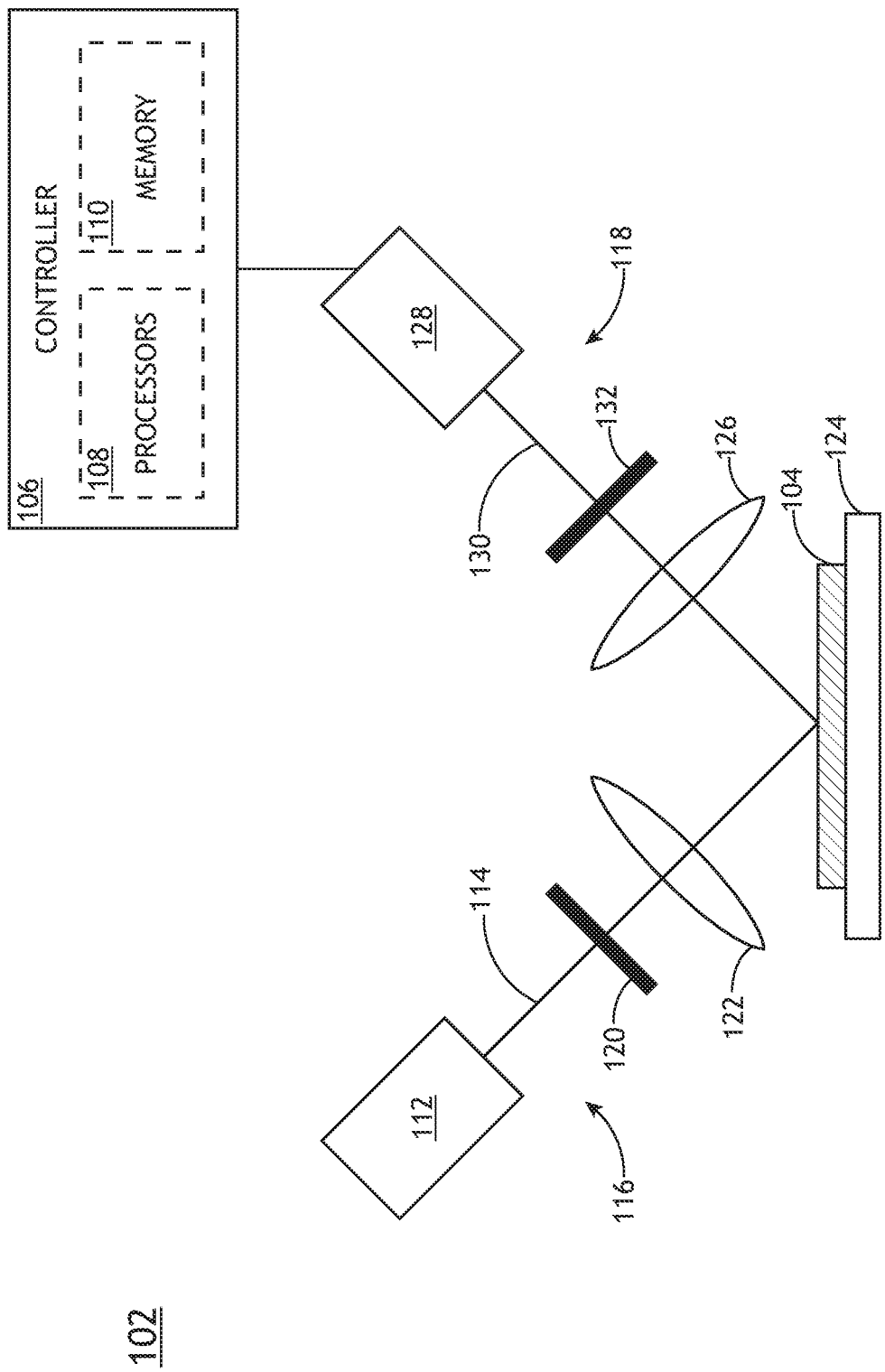
FIG. 1B is a conceptual view illustrating a metrology tool providing oblique angles of incidence, in accordance with one or more embodiments of the present disclosure.

FIG. 1B is a conceptual view of a metrology tool 102 providing oblique angles of incidence, in accordance with one or more embodiments of the present disclosure. For example, the metrology tool 102 illustrated in FIG. 1B may include any type of spectroscopic ellipsometry metrology system known in the art utilizing oblique angles of incidence suitable for providing metrology signals associated with metrology targets on a bonded wafer sample 104.

In one embodiment, the metrology tool 102 includes at least one illumination source 112 to generate illumination (e.g., one or more illumination beams 114). An illumination beam 114 may include one or more selected wavelengths of light transparent to one of more wafers of the bonded wafer sample 104. For example, the illumination source 112 may provide, but is not required to provide, an illumination beam 114 having wavelengths in the range of approximately 150 nm to approximately 2,800 nm. In this regard, the illumination source 112 may generate illumination having wavelengths in any spectral range including, but not limited to, vacuum ultraviolet wavelengths, extreme ultraviolet wavelengths, visible wavelengths, or infrared wavelengths. For example, the illumination source 112 may provide an illumination beam spanning visible and infrared wavelengths such as, but not limited to 750 nm to 2,800 nm. By way of another example, the illumination source 112 may provide an illumination beam spanning ultraviolet wavelengths such as, but not limited to 150 nm to 300 nm. By way of another example, the illumination source 112 may provide an illumination beam spanning ultraviolet and visible wavelengths such as, but not limited to 150 nm to 900 nm. Further, the metrology tool 102 may include any number of illumination sources 112 to provide illumination in any spectral range or ranges.

In another embodiment, the illumination source 112 provides a tunable source of illumination (e.g., one or more tunable lasers, and the like). By way of another example, the illumination source 112 may include a broadband illumination source coupled to a tunable filter.

The illumination source 112 may include, but is not limited to, one or more narrowband laser sources, one or more broadband laser sources, one or more supercontinuum laser sources, one or more white light laser sources, and the like. In this regard, the illumination source 112 may provide an illumination beam 114 having high coherence (e.g., high spatial coherence and/or temporal coherence). In another embodiment, the illumination source 112 includes a lamp source. For example, the illumination source 112 may include, but is not limited to, a laser-sustained plasma (LSP) source, an arc lamp, a discharge lamp, an electrode-less lamp, and the like. In this regard, the illumination source 112 may provide an illumination beam 114 having low coherence (e.g., low spatial coherence and/or temporal coherence).

The illumination source 112 may further provide an illumination beam 114 having any temporal profile. For example, the illumination beam 114 may have a continuous temporal profile, a modulated temporal profile, a pulsed temporal profile, and the like.

In another embodiment, the metrology tool 102 includes an illumination sub-system 116 (e.g., an illumination pathway) to direct the illumination (e.g., one or more illumination beams 114) from the illumination source 112 to the bonded wafer sample 104 and a collection sub-system 118 (e.g., collection pathway) to collect radiation (e.g., light) emanating from the sample 104. The illumination sub-system 116 may include one or more beam conditioning components 120 suitable for modifying and/or conditioning the illumination. For example, the one or more beam conditioning components 120 may include, but are not limited to, an illumination aperture stop, an illumination field stop, one or more polarizers, one or more compensators, one or more filters, one or more beam splitters, one or more diffusers, one or more homogenizers, one or more apodizers, one or more beam shapers, one or more mirrors, or one or more lenses.

In another embodiment, the illumination sub-system 116 may utilize a focusing assembly 122 to focus the illumination from one or more illumination sources 112 onto the bonded wafer sample 104 disposed on a sample stage 124. For example, the focusing assembly 122 may include one or more optical elements having a non-zero optical power. In another embodiment, the collection sub-system 118 may include a collection assembly 126 to collect radiation from the bonded wafer sample 104. For example, the collection assembly 126 may include one or more optical elements having a non-zero optical power.

In another embodiment, the metrology tool 102 includes a detector 128 configured to capture light emanating from the bonded wafer sample 104 (e.g., sample light 130) through the collection sub-system 118. For example, a detector 128 may receive radiation reflected or scattered (e.g., via specular reflection, diffuse reflection, and the like) from the bonded wafer sample 104. By way of another example, a detector 128 may receive radiation generated by the bonded wafer sample 104 (e.g., luminescence associated with absorption of the illumination beam 114, and the like). By way of another example, a detector 128 may receive one or more diffracted orders of radiation from the bonded wafer sample 104 (e.g., 0-order diffraction, ±1-order diffraction, ±2-order diffraction, and the like).

The detector 128 may include any type of optical detector known in the art suitable for measuring illumination received from the bonded wafer sample 104. For example, a detector 128 may include, but is not limited to, a photodiode array (PDA), a CCD detector, a CMOS detector, a TDI detector, a photomultiplier tube (PMT), an avalanche photodiode (APD), and the like. Further, the detector 128 may include any type of sensor having any geometry including, but not limited to, a planar sensor or a line sensor. In another embodiment, a detector 128 may include a spectroscopic detector suitable for identifying wavelengths of radiation emanating from the bonded wafer sample 104.

For measurement techniques involving the collection of spectral data (e.g., spectroscopic reflectometry, spectroscopic ellipsometry, or the like), it may be desirable to generate continuous spectral data over a spectral range of interest. For example, the metrology tool 102 may include a dispersive element (e.g., a prism, a grating, or the like) to spatially disperse light from the overlay target onto one or more detectors 128 to capture a spectral measurement. However, it is recognized herein that the sensitivity of a particular detector 128 may vary as a function of wavelength. Accordingly, the detector 128 may require calibration to account for the variations of sensitivity as a function of wavelength.

In addition to or instead of calibration, the system 100 may include one or more detectors 128 configured to provide a contiguous spectral measurement across a selected range of wavelengths that are spatially distributed across the one or more detectors 128 (e.g., as a selected spatial distribution of wavelengths) using one or more dispersive elements such as, but not limited to gratings or prisms. In one embodiment, the detector 128 includes a "hybrid" sensor (e.g., a hybrid InGaAs sensor for infrared wavelengths) having optimized sensitivity to different spectral regions assembled into a single sensor package. In this regard, the hybrid sensor may produce a single, contiguous measurement of spectral data covering a large range of wavelengths. As a non-limiting example, such a hybrid sensor may produce a contiguous measurement of spectral data covering a selected range of wavelengths such as, but not limited to, wavelengths from 950 nm to 2800 nm. In another embodiment, the detector 128 may be formed from two or more sensors assembled on a chip in a manner such that a contiguous spectrum may be derived from the chip. In this regard, the two or more sensors may be oriented along the spatial distribution of wavelengths. Further, it may be the case that any configuration of the detector 128 may need to be calibrated such to account for any variations of sensitivity of the detector 128 (or portions thereof) as a function of wavelength across the spatial distribution of wavelengths across the detector 128. For example, the detector 128 may include a single sensor having calibrated sensitivity across the selected spatial distribution of wavelengths. By way of another example, the detector 128 may include two or more sensors having calibrated sensitivities across the selected spatial distribution of wavelengths.

In another embodiment, the metrology tool 102 may include multiple detectors 128 to facilitate multiple metrology measurements by the metrology tool 102. In this regard, the metrology tool 102 depicted in FIG. 1B may perform multiple simultaneous metrology measurements.

The collection sub-system 118 may further include any number of collection beam conditioning elements 132 to direct and/or modify illumination collected by the collection assembly 126 including, but not limited to, a collection aperture stop, a collection field stop, one or more mirrors, one or more lenses, one or more filters, one or more polarizers, or one or more compensators.

It is contemplated herein that a metrology tool 102 configured as a spectroscopic ellipsometer may illuminate the bonded wafer sample 104 at any selected angle of incidence (AOI) and at any selected azimuth angle from 0 to 360 degrees. Further, the spectroscopic ellipsometer may provide a series of measurements at various combinations of angle of incidence and azimuth angles. In one embodiment, the metrology tool 102 is configured to illuminate metrology targets on a bonded wafer sample 104 at one or more angles of incidence greater than approximately 35 degrees with respect to a surface normal of the bonded wafer sample 104.

Figure 1C:
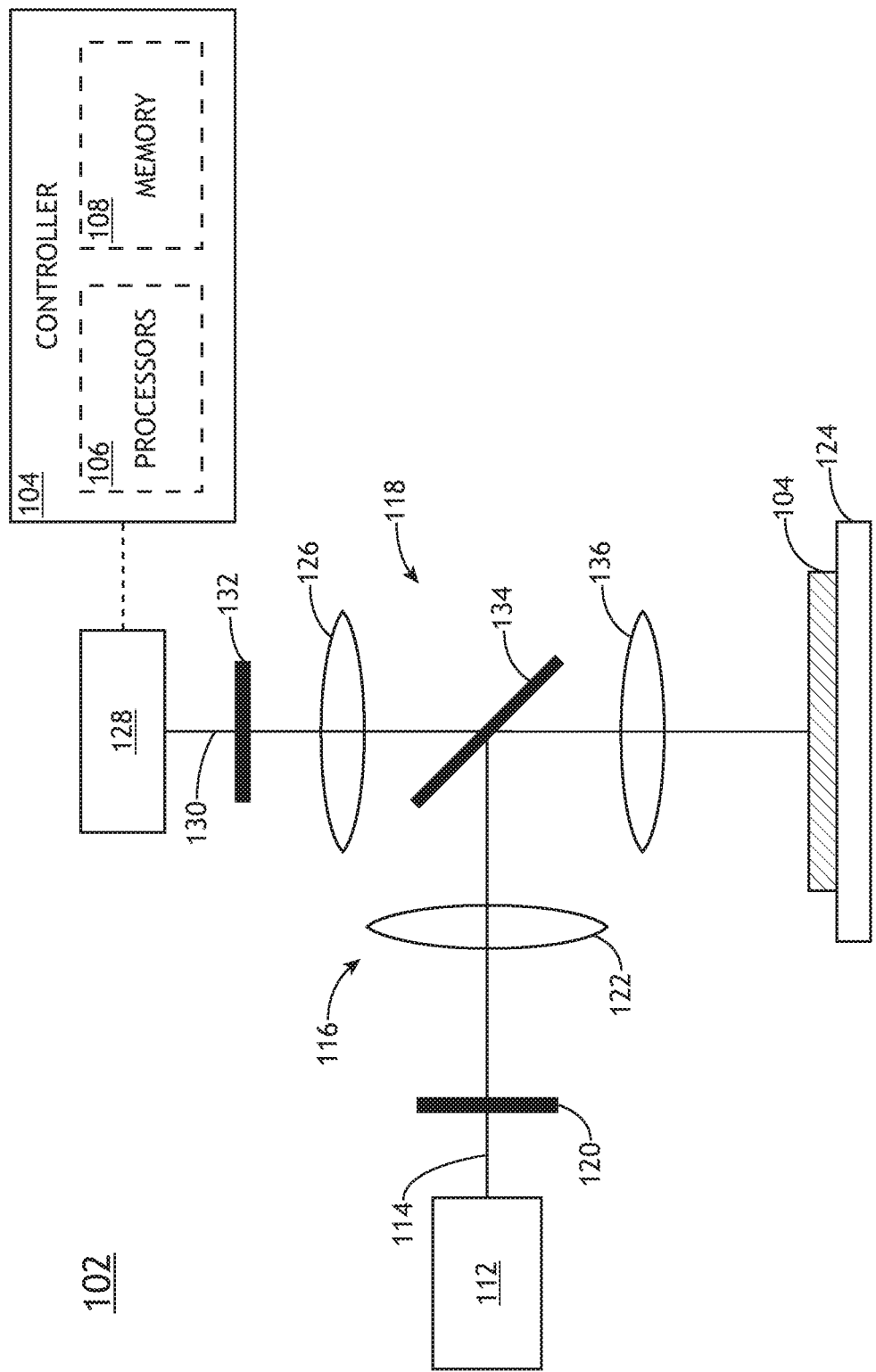
FIG. 1C is a conceptual view illustrating a metrology tool providing near-normal angles of incidence, in accordance with one or more embodiments of the present disclosure.

FIG. 1C is a conceptual view illustrating a metrology tool 102 providing near-normal angles of incidence, in accordance with one or more embodiments of the present disclosure. For example, the metrology tool 102 illustrated in FIG. 1C may include any type of spectroscopic reflectometry metrology system known in the art utilizing near-normal angles of incidence suitable for providing metrology signals associated with metrology targets on a bonded wafer sample 104.

In one embodiment, the metrology tool 102 includes a beamsplitter 134 oriented such that an objective lens 136 may simultaneously direct the illumination from one or more illumination sources 112 (e.g., one or more illumination beams 114) to the bonded wafer sample 104 and collect radiation reflecting from the bonded wafer sample 104.

It is contemplated herein that a metrology tool 102 configured as a spectroscopic reflectometer may illuminate the bonded wafer sample 104 at any selected angle of incidence (AOI) and at any selected azimuth angle from 0 to 360 degrees. Further, the spectroscopic ellipsometer may provide a series of measurements at various combinations of angle of incidence and azimuth angles. In one embodiment, the metrology tool 102 is configured to illuminate metrology targets on a bonded wafer sample 104 at one or more angles of incidence ranging from approximately 5 degrees to 40 degrees with respect to a surface normal of the bonded wafer sample 104.

In one embodiment, the metrology tool 102 is configured to provide signals indicative of one or more optical properties of a metrology target (e.g., one or more dispersion parameters, and the like) in one or more measurement configurations (e.g., one or more wavelengths, one or more angles of incidence, one or more azimuth angles, or the like). For example, the metrology tool 102 may include, but is not limited to, a spectrometer, a spectroscopic reflectometer, a polarized reflectometer, a spectroscopic reflectometer for measuring Mueller matrix elements (e.g., using rotating compensators), a single-wavelength reflectometer, an angle-resolved reflectometer (e.g., a beam-profile reflectometer), an imaging system, a pupil imaging system, a spectral imaging system, or a scatterometer. In one embodiment, the metrology tool 102 includes an image-based metrology tool to measure metrology data based on the generation of one or more images of a bonded wafer sample 104.

Referring now generally to FIGS. 1B and 1C, it is noted herein that the metrology tool 102 may facilitate multi-angle illumination of the bonded wafer sample 104, and/or more than one illumination source 112 (e.g., coupled to one or more additional detectors 128) using a variety of techniques. For example, in the configuration of FIG. 1B, one or more optical components may be mounted to a rotatable arm (not shown) pivoting around the bonded wafer sample 104 such that the angle of incidence of the illumination beam 114 on the bonded wafer sample 104 may be controlled by the position of the rotatable arm. By way of another example, in the configuration of FIG. 1C, the path of the illumination beam 114 through the beamsplitter 134 and the objective lens 136 may be adjusted to control the angle of incidence of the illumination beam 114 on the bonded wafer sample 104. In this regard, the illumination beam 114 may have a nominal path through the beamsplitter 134 and the objective lens 136 such that the illumination beam 114 has a normal incidence angle on the bonded wafer sample 104. Further, the angle of incidence of the illumination beam 114 on the bonded wafer sample 104 may be controlled by modifying the position and/or angle of the illumination beam 114 on the beamsplitter 134 (e.g. by rotatable mirrors, a spatial light modulator, a free-form illumination source, or the like).

In some embodiments, the metrology tool 102 is configured to provide an off-axis geometry for illumination and/or collection. In one embodiment, the metrology tool 102 is configured to illuminate the overlay target with oblique illumination. For example, the illumination angle may be adjusted based on any of the above techniques for controlling the illumination angle. By way of another example, the objective lens 136 may be configured to provide oblique illumination. For instance, the objective lens 136 may include, but is not limited to, a Schwarzschild objective. In another embodiment, the metrology tool 102 is configured to illuminate the bonded wafer sample 104 at normal incidence and collect light from the overlay target at oblique angles. For example, the collection sub-system 118 may have a central obscuration at or near an aperture stop (or a plane conjugate to the aperture stop).

Figure 2:
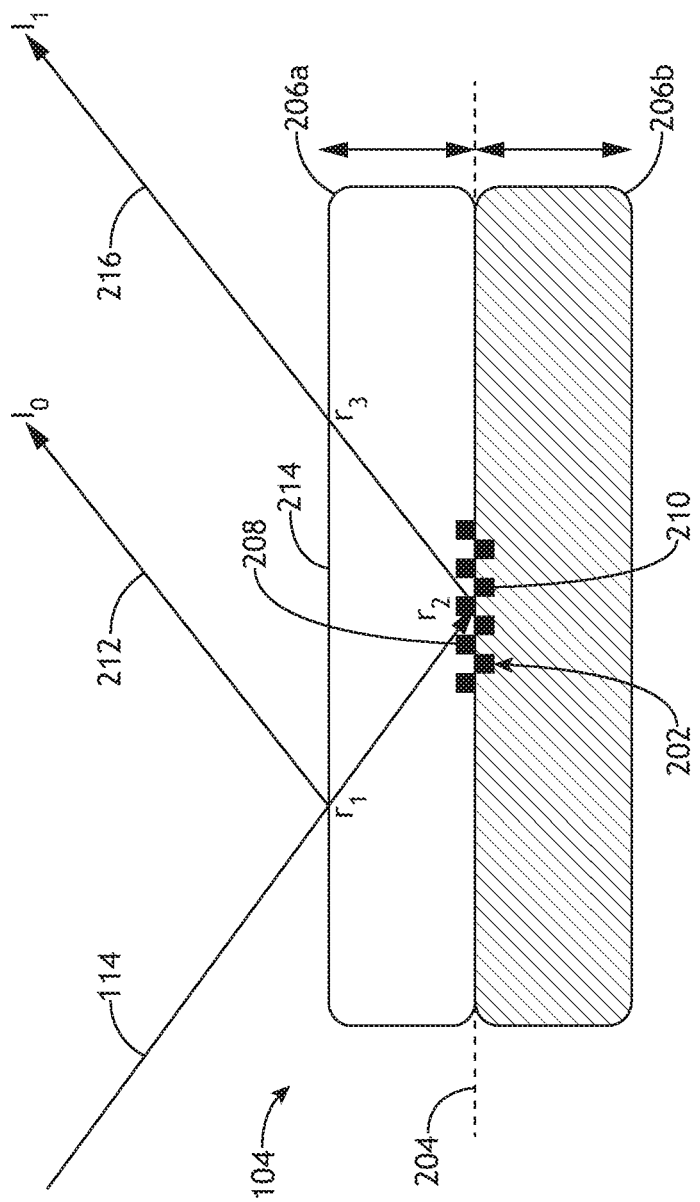
FIG. 2 is a profile view of an overlay target at an interface between two wafers of a bonded wafer sample in accordance with one or more embodiments of the present disclosure.

Referring now to FIG. 2, a profile view of an overlay target 202 at an interface 204 between two wafers of a bonded wafer sample 104 is shown in accordance with one or more embodiments of the present disclosure. In one embodiment, a bonded wafer sample 104 includes a first wafer 206a (e.g., a top wafer) and a second wafer 206b (e.g., a bottom wafer), where the overlay target 202 includes target features located on both wafers. For example, the overlay target 202 illustrated in FIG. 2 includes a set of first-wafer target elements 208 on the first wafer 206a and a set of second-wafer target elements 210 on the second wafer 206b. In this regard, the alignment of the first-wafer target elements 208 with respect to the second-wafer target elements 210 is indicative of the alignment of the first wafer 206a relative to the second wafer 206b and thus the overlay of the bonded wafer sample 104.

The first-wafer target elements 208 and the second-wafer target elements 210 may be located on any layer of the first wafer 206a and the second wafer 206b. For example, the first wafer 206a and/or the second wafer 206b may include one or more layers of material deposited on a substrate of constant or varying thickness, out of which the target elements may be formed. Further, the first-wafer target elements 208 and the second-wafer target elements 210 may be formed from any type of material including, but not limited to a metal.

FIG. 3A is a profile view of an overlay target 202 formed from metallic target elements in accordance with one or more embodiments of the present disclosure. In the embodiment illustrated in FIG. 3A, the first wafer 206a includes an 8 µm layer of $SiO_2$ 302 deposited on a 775 µm-thick substrate 304 (e.g., a silicon wafer), and the second wafer 206b includes a 2 µm layer of $SiO_2$ 306 deposited on a 775 µm-thick substrate 308 (e.g., also a silicon wafer). The overlay target 202 is then formed from 100 nm thick metallic structures 310 embedded into the 8 µm layer of $SiO_2$ 302 and the 2 µm layer of $SiO_2$ 306 near the interface 204.

The overlay target 202 at the interface 204 may include any type of overlay target known in the art suitable for characterizing the overlay between the first wafer 206a and the second wafer 206b. In one embodiment, the overlay target 202 includes a critical dimension (CD) overlay target. FIG. 3B is a profile view of an overlay target element (e.g., a first-wafer target elements 208 or a second-wafer target elements 210) of a CD overlay target 202 in accordance with one or more embodiments of the present disclosure. For example, the overlay target element in FIG. 3B is characterized by dimensions CD1, CD2, and CD3. In another embodiment, the overlay target 202 includes a diffraction-based overlay (DBO) target. In this regard, the overlay target 202 may be formed from periodically distributed elements such that the overlay may be determined based on a diffraction pattern from the overlay target 202. Further, the first-wafer target elements 208 and the second-wafer target elements 210 may have the same or different pitches. For example, as illustrated in FIG. 3A, the first-wafer target elements 208 may be distributed with a first pitch 312 and the second-wafer target elements 210 may be distributed with a second pitch 314.

It is to be understood, however, that the illustrations of the overlay target 202 in FIGS. 3A and 3B are provided solely for illustrative purposes and should not be interpreted as limiting. For example, although not shown, an overlay target 202 of a bonded wafer sample 104 may include target features on two or more layers of the first wafer 206a and/or the second wafer 206b. By way of another example, the overlay target 202 may be any type of overlay target known in the art including, but not limited to, a proxy target or a design-rule target. A design-rule target may include target features on a similar scale as device features associated with a fabricated device. For instance, target features on a design-rule target may have similar dimensions, orientation, periodicity, and/or density as device features. In this regard, the printing characteristics of target features and device features may be substantially similar. In contrast, a proxy target may have target features with substantially different scales than device features. In this regard, a proxy target may be designed to accommodate a particular overlay metrology tool or overlay algorithm.

Figure 4:
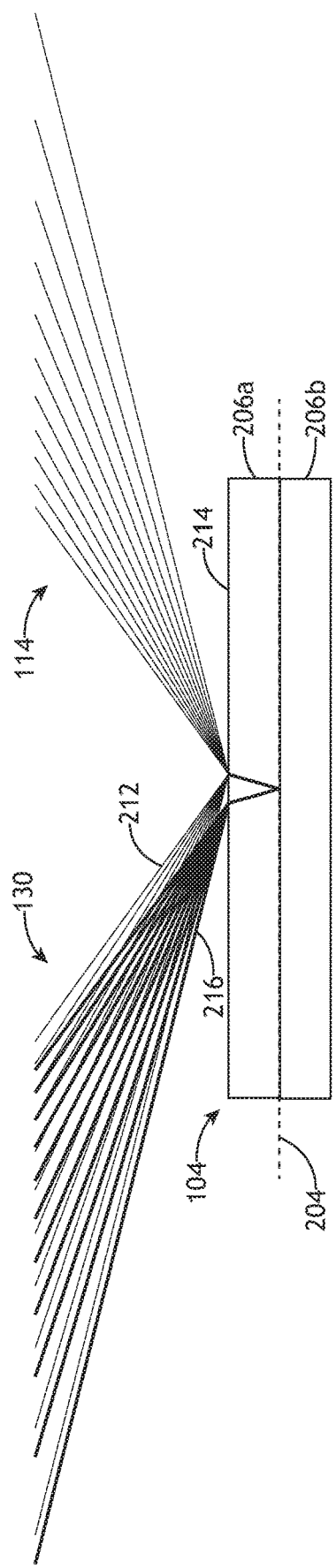
FIG. 4 is a simulated ray diagram illustrating beam paths of top-surface reflection and target-generated light in response to a focused illumination beam, in accordance with one or more embodiments of the present disclosure.

Referring again to FIG. 2, it is contemplated herein that illuminating an overlay target 202 at an oblique angle with respect to a surface normal may generally result in reflected light emanating from the sample along different paths. For example, an incident illumination beam 114 may generate a top-surface reflection 212 ($I_0$) associated with light reflected from the top surface 214 of the first wafer 206a and target-reflected light 216 ($I_1$) associated with light reflected by the overlay target 202 at the interface 204. FIG. 4 is a simulated ray diagram illustrating beam paths of top-surface reflection 212 ($I_0$) and target-reflected light 216 ($I_1$) in response to a focused illumination beam 114, in accordance with one or more embodiments of the present disclosure. In this simulation, only specular reflection is presented for clarity and scattering or diffraction from the overlay target 202 is omitted.

It is further contemplated herein that the target-reflected light 216 ($I_1$) contains information relevant to the determination of the overlay between the first wafer 206a and the second wafer 206b. Accordingly, the metrology tool 102 may be configured to ensure that the target-reflected light 216 ($I_1$) is directed to the detector 128 to enable overlay measurements between the first wafer 206a and the second wafer 206b.

In one embodiment, the metrology tool 102 focuses or otherwise directs illumination (e.g., at least one illumination beam 114) to the overlay target 202 at the interface 204 between the first wafer 206a and the second wafer 206b rather than to the top surface 214 (e.g., using the focusing assembly 122 and/or the objective lens 136 in the configurations illustrated in FIGS. 1B and 1C). Further, the metrology tool 102 may include one or more optical elements in the illumination sub-system 116 and/or the collection sub-system 118 to ensure that the target-reflected light 216 ($I_1$) is directed to the detector 128 such that the resulting measurements of the overlay target 202 may be indicative of the overlay between the first wafer 206a and the second wafer 206b.

In some embodiments, the metrology tool 102 includes optical elements in the illumination sub-system 116 and/or the collection sub-system 118 to isolate the target-reflected light 216 ($I_1$) from the top-surface reflection 212 ($I_0$). In this regard, the detector 128 only captures the target-reflected light 216 ($I_1$). The target-reflected light 216 ($I_1$) may be isolated from the top-surface reflection 212 ($I_0$) using various techniques within the spirit and scope of the present disclosure.

Figure 5:
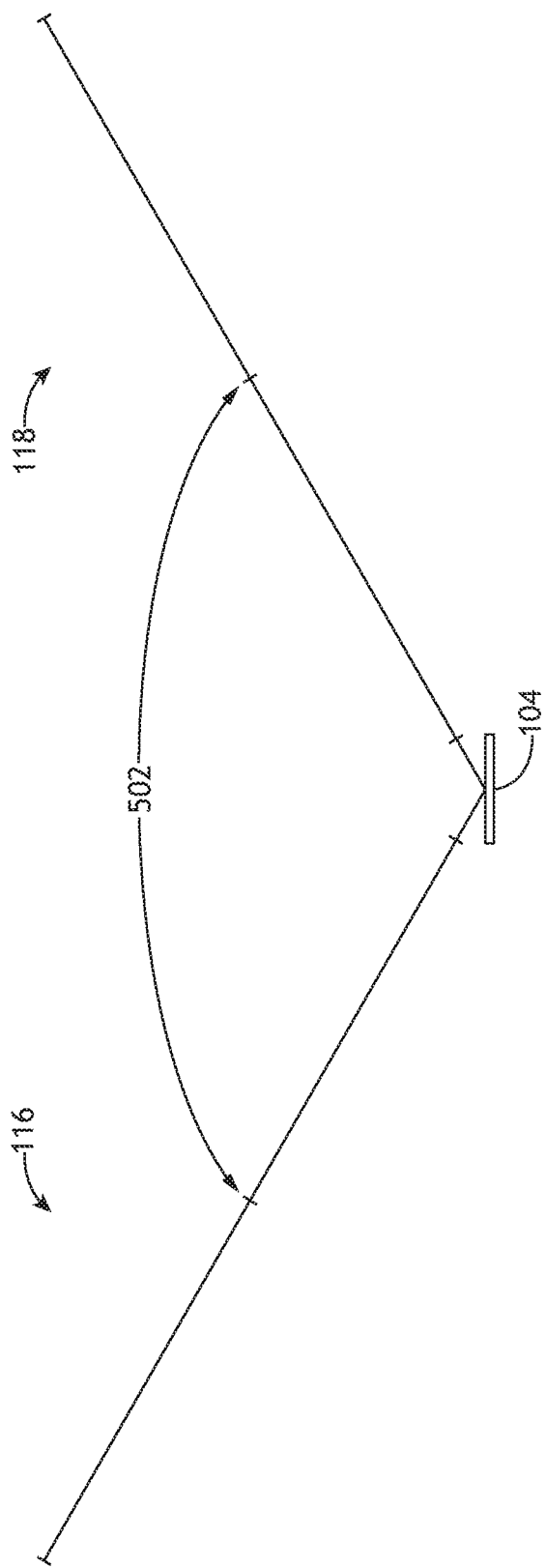
FIG. 5 is a conceptual view of a metrology tool including cylindrical lenses in both an illumination sub-system and a collection sub-system in accordance with one or more embodiments of the present disclosure.

For example, the metrology tool 102 may include asymmetric optical elements such as, but not limited to, cylindrical or aspherical elements in the illumination sub-system 116 and/or the collection sub-system 118 to isolate the target-reflected light 216 ($I_1$) from the top-surface reflection 212 ($I_0$). In this regard, the target-reflected light 216 ($I_1$) and the top-surface reflection 212 ($I_0$) may exit the bonded wafer sample 104 at different spatial locations and may further be focused or imaged to different locations. FIG. 5 is a conceptual view of a metrology tool 102 including cylindrical lenses 502 in both the illumination sub-system 116 and the collection sub-system 118 in accordance with one or more embodiments of the present disclosure. In this configuration, the second-wafer target elements 210 may be spatially isolated and directed to the detector 128.

By way of another example, the collection sub-system 118 may include separate optical elements to collect or otherwise receive the target-reflected light 216 ($I_1$) and the top-surface reflection 212 ($I_0$). It may be the case that the target-reflected light 216 ($I_1$) and the top-surface reflection 212 ($I_0$) may have sufficiently different optical paths that they may be spatially separated. Accordingly, the target-reflected light 216 ($I_1$) may be separately collected and directed to the detector 128 (e.g., passed) with dedicated optical elements. The top-surface reflection 212 ($I_0$) may then be separately collected or disregarded (e.g., blocked, redirected, or the like). In one instance, the top-surface reflection 212 ($I_0$) may be blocked by a field stop (e.g., a stop located at a plane conjugate to the bonded wafer sample 104, a beam block, or the like. In another instance, the top-surface reflection 212 ($I_0$) may be separately collected and directed to a detector 128. In this regard, the top-surface reflection 212 ($I_0$) may itself be monitored or utilized for metrology. Further, the collection sub-system 118 may include any combination of free-space or fiber-coupled optical elements to receive the target-reflected light 216 ($I_1$) and/or the top-surface reflection 212 ($I_0$).

By way of another example, the collection sub-system 118 may include one or more optical elements to align the target-reflected light 216 ($I_1$) and the top-surface reflection 212 ($I_0$) along a common (e.g., collocated) optical path. In this regard, the detector 128 may capture both the target-reflected light 216 ($I_1$) and the top-surface reflection 212 ($I_0$). Although the target-reflected light 216 ($I_1$) and the top-surface reflection 212 ($I_0$) may generally have different paths as illustrated in FIGS. 2 and 4, it may be the case that the difference between the optical paths (e.g., the difference between the angles at which the light emanates from the bonded wafer sample 104) is sufficiently small that it may be impractical to separate the target-reflected light 216 ($I_1$) from the top-surface reflection 212 ($I_0$). In this case, the target-reflected light 216 ($I_1$) and the top-surface reflection 212 ($I_0$) may be spatially overlapped on the detector 128. Further, the collection sub-system 118 may include any type of optical elements to align the target-reflected light 216 ($I_1$) and the top-surface reflection 212 ($I_0$) along a common optical path including, but not limited to, one or more prisms or one or more mirrors.

If the target-reflected light 216 ($I_1$) and the top-surface reflection 212 ($I_0$) are collocated on the detector 128, the contributions of the target-reflected light 216 ($I_1$) and the top-surface reflection 212 ($I_0$) may be, but are not required to be, isolated algorithmically. For instance, the target-reflected light 216 ($I_1$) may be algorithmically isolated from the top-surface reflection 212 ($I_0$) based on differences in spatial and/or spectral characteristics. In particular, the target-reflected light 216 ($I_1$) may differ from the top-surface reflection 212 ($I_0$) based on interaction with the overlay target 202 and propagation through the first wafer 206a.

Figure 6:
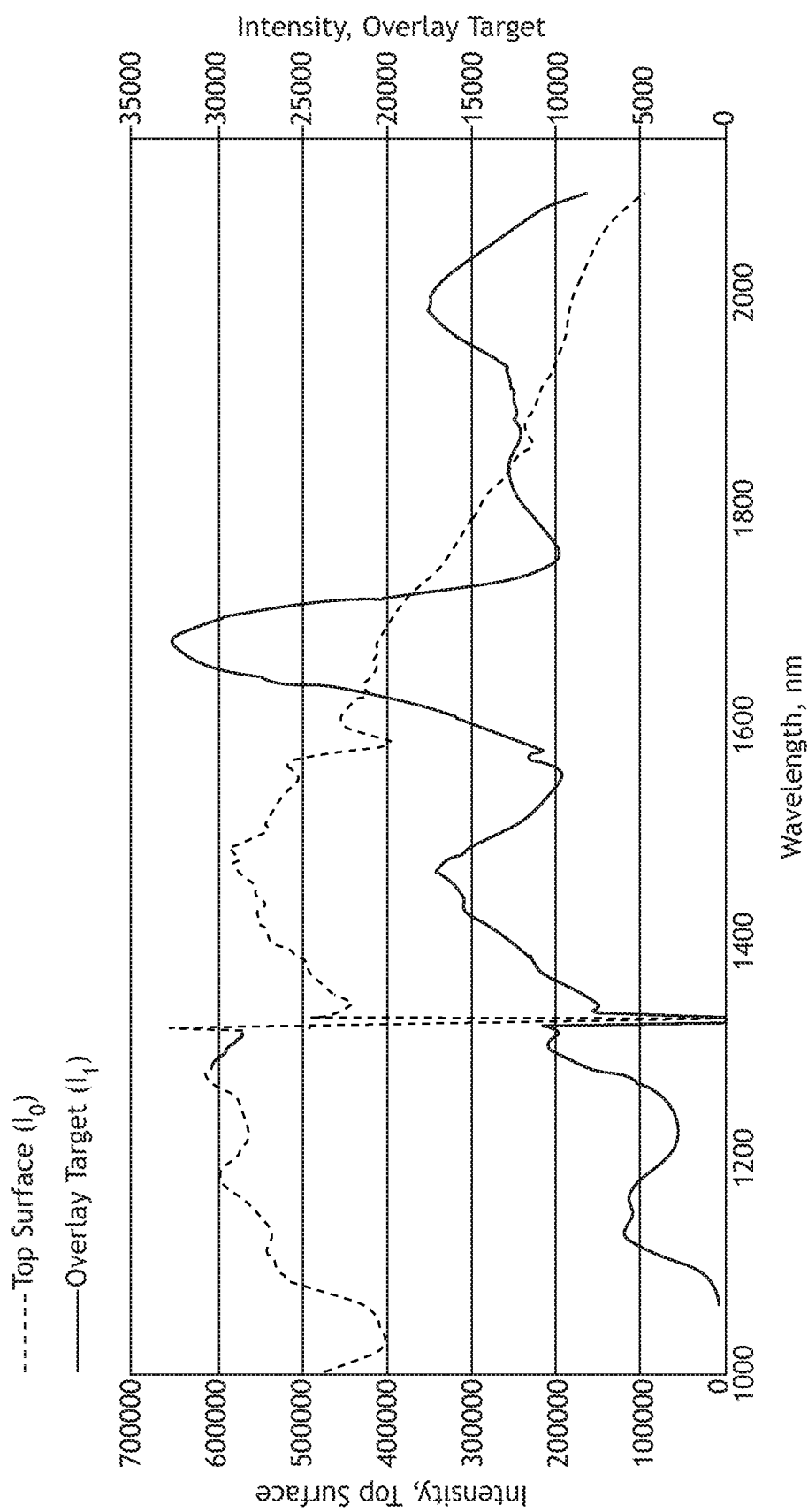
FIG. 6 is a plot of measured signals corresponding to amounts of light reflected off the overlay target and off the top surface of a silicon bonded-wafer sample as a function of wavelength generated using oblique illumination in accordance with one or more embodiments of the present disclosure.

FIG. 6 is a plot of measured signals corresponding to amounts of light reflected off the overlay target 202 (e.g., the target-reflected light 216 ($I_1$)) and light reflected off the top surface of a silicon bonded-wafer sample (e.g., the top-surface reflection 212 ($I_0$)) as a function of wavelength generated using oblique illumination in accordance with one or more embodiments of the present disclosure. This data illustrates the feasibility of separately measuring the target-reflected light 216 ($I_1$) and the top-surface reflection 212 ($I_0$). For example, FIG. 6 illustrates the onset of the target-reflected light 216 ($I_1$) for wavelengths above approximately 1100 nm, corresponding to the cutoff wavelength for transmission through silicon. Further, the target-reflected light

216 ($I_1$) includes various spectral features that differ from the top-surface reflection 212 ($I_0$) that are indicative of the overlay between the first wafer 206a and the second wafer 206b.

Figure 7:
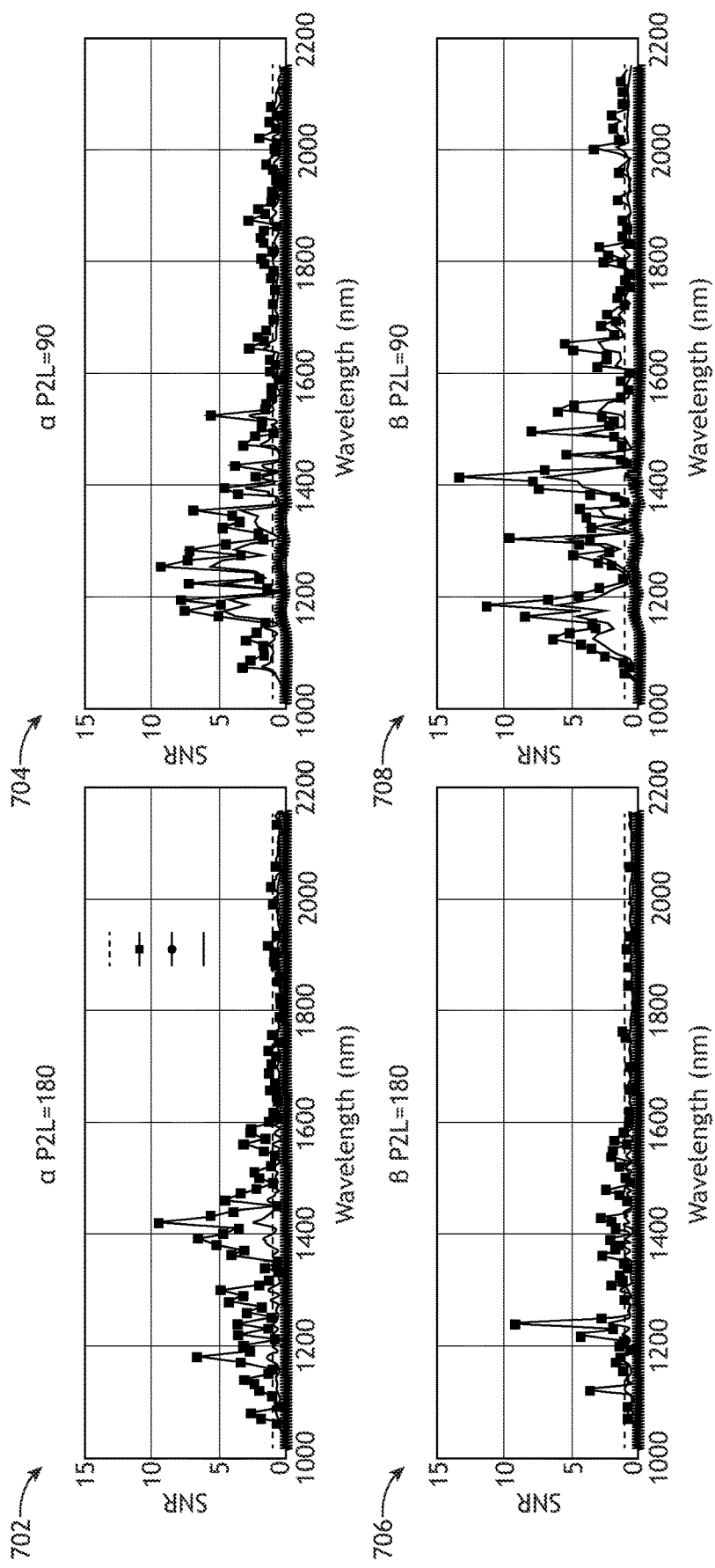
FIG. 7 includes plots of spectroscopic ellipsometry (SE) Alpha and Beta values as a function of known overlay errors on test overlay targets in accordance with one or more embodiments of the present disclosure.

Referring now to FIG. 7, techniques for determining overlay between the first wafer 206a and the second wafer 206b based on oblique illumination are described in greater detail.

In a general sense, any metrology algorithm known in the art suitable for determining overlay based on oblique illumination of the overlay target 202 at the interface 204 between the first wafer 206a and the second wafer 206b.

An overlay target 202 may generally include target designs placed on the semiconductor wafer for use (e.g., with alignment, overlay registration operations, and the like). Further, targets may be located at multiple sites on the semiconductor wafer. For example, targets may be located within scribe lines (e.g., between dies) and/or located in the die itself. Multiple overlay targets 202 may be measured simultaneously or serially by the same or multiple metrology tools as described in U.S. Pat. No. 7,478,019 issued on Jan. 13, 2009, which is incorporated herein by reference in its entirety.

As described previously herein, embodiments of the present disclosure may incorporate any type of metrology tool 102 known in the art including, but not limited to, a spectroscopic ellipsometer with one or more angles of illumination, a spectroscopic ellipsometer for measuring Mueller matrix elements (e.g. using rotating compensators), a single-wavelength ellipsometer, an angle-resolved ellipsometer (e.g. a beam-profile ellipsometer), a spectroscopic reflectometer, a polarized reflectometer, a spectroscopic reflectometer for measuring Mueller matrix elements (e.g. using rotating compensators), a single-wavelength reflectometer, an angle-resolved reflectometer (e.g. a beam-profile reflectometer), an imaging system, a pupil imaging system, a spectral imaging system, or a scatterometer.

Accordingly, the metrology tool 102 may measure characteristics of an overlay target 202 such as, but not limited to, critical dimensions (CD), overlay, sidewall angles, film thicknesses, or process-related parameters (e.g., focus, dose, and the like). The targets may include certain regions of interest that are periodic in nature, such as gratings in a memory die. The overlay target 202 may further possess various spatial characteristics and are typically constructed of one or more cells which may include features in one or more layers which may have been printed in one or more lithographically distinct exposures. The overlay target 202 or the cells may possess various symmetries such as two-fold or four-fold rotation symmetry, reflection symmetry. Examples of such metrology structures are described in U.S. Pat. No. 6,985,618, which is included herein by reference in its entirety. Different cells or combinations of cells may belong to distinct layers or exposure steps. The individual cells may comprise either isolated non-periodic features or alternately they may be constructed from one, two or three-dimensional periodic structures or combinations of non-periodic and periodic structures. The periodic structures may be non-segmented or they may be constructed from finely segmented features which may be at or close to the minimum design rule of the lithographic process used to print them.

Further, the metrology system 100 may include a single metrology tool 102 or multiple metrology tools 102. A metrology system 100 incorporating multiple metrology tools 102 is generally described in U.S. Pat. No. 7,933,026 issued on Apr. 26, 2011 and U.S. Pat. No. 7,478,019 issued on Jan. 13, 2009, both of which are incorporated herein by reference in their entirety. Focused beam ellipsometry based on primarily reflective optics is generally described in U.S. Pat. No. 5,608,526 issued on Mar. 4, 1997, which is incorporated herein by reference in its entirety. The use of apodizers to mitigate the effects of optical diffraction causing the spread of the illumination spot beyond the size defined by geometric optics is generally described in U.S. Pat. No. 5,859,424 issued on Jan. 12, 1999, which is incorporated herein by reference in its entirety. The use of high-numerical-aperture tools with simultaneous multiple angle-of-incidence illumination is generally described by U.S. Pat. No. 6,429,943 issued on Aug. 6, 2002, which is incorporated herein by reference in its entirety.

In the case of a system 100 having multiple metrology tools 102, the corresponding data may be generated either simultaneously (e.g., using multiple detectors 128) or sequentially using one or more detectors 128. For example, the metrology tool 102 may include both a reflectometry tool of any type and an ellipsometry tool of any type. The metrology tool 102 may thus generate both reflectometry data and ellipsometry data for the determination of the overlay between the first wafer 206a and the second wafer 206b.

Additionally, measurement of parameters of interest may involve a number of algorithms. For example, optical interaction of an illumination beam 114 with a metrology target on the bonded wafer sample 104 may, but is not limited to, be modeled using an electro-magnetic (EM) solver. Further, the EM solver may utilize any method known in the art including, but not limited to, rigorous coupled-wave analysis (RCWA), finite element method analysis, method of moments analysis, a surface integral technique, a volume integral technique, or a finite-difference time-domain analysis. Additionally, collected data may be analyzed using data fitting and optimization techniques including, but not limited to libraries, fast-reduced-order models, regression, machine-learning algorithms such as neural networks, support-vector machines (SVM), dimensionality-reduction algorithms (e.g. principal component analysis (PCA), independent component analysis (ICA), local-linear embedding (LLE), and the like), sparse representation of data (e.g., Fourier or wavelet transforms, Kalman filters, algorithms to promote matching from same or different tool types, and the like). For example, data collection and/or fitting may be, but is not required to be, performed by the Signal Response Metrology (SRM) software product provided by KLA Corporation.

The metrology target may be modeled (parametrized) using a geometric engine, or in some cases, process modeling engine or a combination of both. The use of process modeling is described generally in U.S. Pat. No. 10,769,320 issued on Sep. 8, 2020, which is incorporated herein by reference in its entirety. A geometric engine is implemented, for example, in AcuShape software product of KLA Corporation. The use of symmetric target design in scatterometry overlay metrology is generally described in U.S. Pat. No. 9,739,702 issued on Aug. 22, 2017, which is incorporated herein by reference in its entirety. It is noted herein that computational algorithms performed by the controller may be, but are not required to be, tailored for metrology applications through the use of parallelization, distributed computation, load-balancing, multi-service support, design and implementation of computational hardware, or dynamic load optimization. Further, various implementations of algorithms may be, but are not required to be, performed by the controller (e.g., though firmware, software, or field-programmable gate arrays (FPGAs), and the like), or one or more programmable optical elements associated with the metrology tool. The use of process modeling is generally described in U.S. Patent Publication No. 2014/0172394 titled "Integrated use of model-based metrology and a process model" and published on Jun. 19, 2014, which is incorporated herein by reference in its entirety.

In another embodiment, raw data generated by a metrology tool 102 is analyzed by algorithms that do not include modeling, optimization and/or fitting (e.g., phase characterization, or the like), which is generally described in U.S. Pat. No. 9,739,702 issued on Aug. 22, 2017, U.S. Pat. No. 9,581,430 issued on Feb. 28, 2017, and U.S. Pat. No. 10,591,406 on Mar. 17, 2020, all of which are incorporated herein by reference in its entirety.

The metrology tool 102 may further measure the composition of one or more layers of the bonded wafer sample 104, measure certain defects on (or within) the bonded wafer sample 104, and/or measure the amount of photolithographic radiation exposed to the bonded wafer sample 104. In some cases, the metrology tool 102 and/or associated measurement algorithms to be applied to the data derived from the metrology tool 102 may be configured for measuring non-periodic targets. For example, electromagnetic simulations in metrology is generally described in U.S. Pat. No. 9,915,522 issued on Mar. 13, 2018 and U.S. Pat. No. 9,291,554 issued on Mar. 22, 2016 both of which are incorporated by reference in their entirety.

FIG. 7 includes plots 702-708 of spectroscopic ellipsometry (SE) Alpha and Beta values as a function of known overlay errors (e.g., pitch offsets) on test overlay targets 202 in accordance with one or more embodiments of the present disclosure. In particular, plots 702-708 illustrate the SE Alpha and Beta values for pitch offsets ranging from 1 nm to 16 nm.

A measurement of the overlay between the first wafer 206a and the second wafer 206b may be determined using any technique known in the art. As illustrated in FIG. 7, for each measurement condition, the strength of the spectral signal generally increased with increasing overlay error. In one embodiment, the magnitude of the overlay error is determined based on the strength of the measured signal. In the particular example illustrated in FIG. 7, the sensitivity of the system 100 is approximately 5-10 nm. In another embodiment, the magnitude and/or direction of overlay is determined using model-based algorithm such as, but not limited to, a RCWA-based algorithm to provide a relationship between measured data and the overlay. In another embodiment, the magnitude and/or direction of overlay is determined using a machine-learning technique such as, but not limited to, a neural network technique to provide a relationship between measured data and the overlay. For example, a series of samples having known overlay measurements may be measured to provide training data for a machine-learning algorithm. Accordingly, after training the machine-learning algorithm, the machine-learning algorithm may provide a determination of the overlay based on measurements of samples with unknown overlays.

Figure 8:
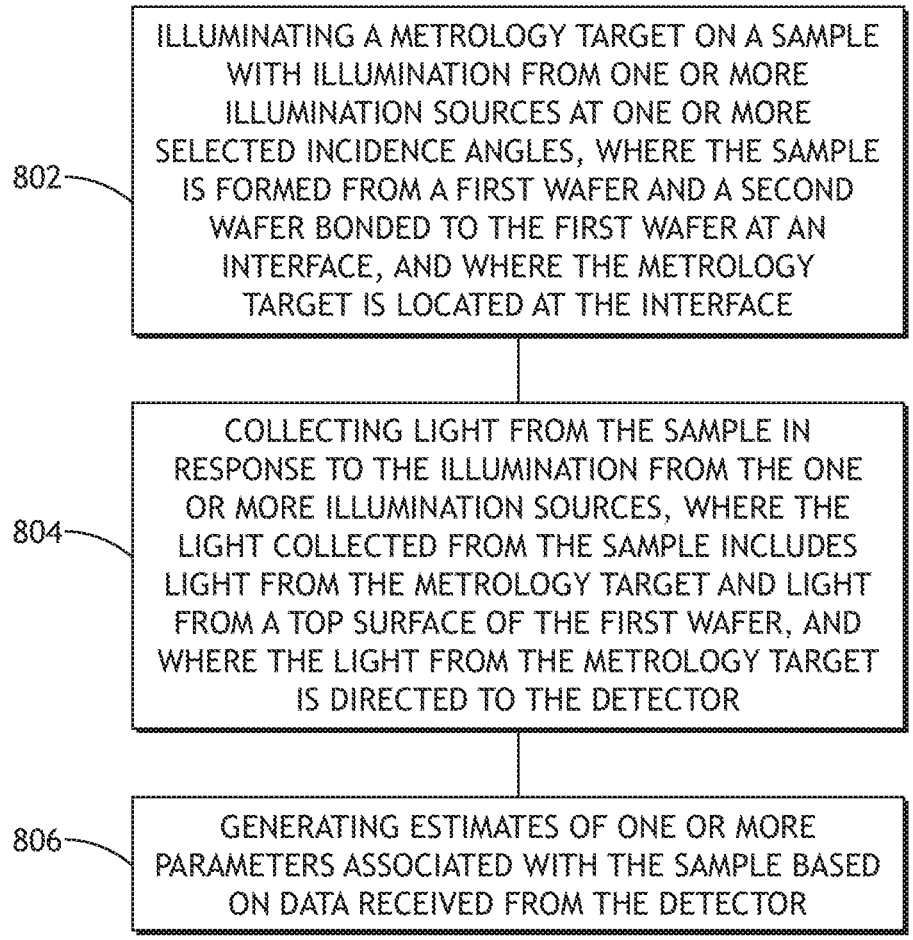
FIG. 8 is a flow diagram illustrating steps performed in a metrology method, in accordance with one or more embodiments of the present disclosure.

FIG. 8 is a flow diagram illustrating steps performed in a metrology method 800, in accordance with one or more embodiments of the present disclosure. Applicant notes that the embodiments and enabling technologies described previously herein in the context of the system 100 should be interpreted to extend to method 800. It is further noted, however, that the method 800 is not limited to the architecture of the system 100.

In one embodiment, the method 800 includes a step 802 of illuminating a metrology target on a sample with illumination from one or more illumination sources at one or more selected incidence angles, where the sample is formed from a first wafer and a second wafer bonded to the first wafer at an interface, and where the metrology target is located at the interface.

In another embodiment, the method 800 includes a step 804 of collecting light from the sample in response to the illumination from the one or more illumination sources, where the light collected from the sample includes light from the metrology target and light from a top surface of the first wafer, and where the light from the metrology target is directed to the detector. For example, step 804 may include isolating the light from the metrology target from the light from the top of the sample. In this regard, only the light from the metrology target may be captured. By way of another example, the step 804 may include aligning the light from the metrology target with the light from the top of the sample. Further, the light from the metrology target may be isolated algorithmically. For instance, the light from the metrology target may be isolated based on known parameters such as, but not limited to, the wavelength of illumination light, an illumination angle, a thickness of the first wafer, a transmissivity of the first wafer, or a design of the metrology target.

In another embodiment, the method 800 includes a step 806 of generating (e.g., with processors 108 of the controller 106) estimates of one or more parameters associated with the sample based on data received from the detector. For example, one or more parameters may include, but is not limited to overlay of the two wafers of the bonded wafer sample 104. In this embodiment, the overlay error may be determined based on any combination of reflectometry and/or ellipsometry techniques. Further, the overlay error may be determined based on modeling of light interactions in the sample (e.g., using RCWA techniques, or the like). In some instances, the overlay error may be determined based on machine learning algorithms in which measured signals from targets having known offsets are used as training data.

One skilled in the art will recognize that the herein described components operations, devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components, operations, devices, and objects should not be taken as limiting.

As used herein, directional terms such as "top," "bottom," "over," "under," "upper," "upward," "lower," "down," and "downward" are intended to provide relative positions for purposes of description, and are not intended to designate an absolute frame of reference. Various modifications to the described embodiments will be apparent to those with skill in the art, and the general principles defined herein may be applied to other embodiments.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A metrology system comprising:
    a metrology tool comprising:
        one or more illumination sources;
        one or more illumination optics configured to direct illumination from the one or more illumination sources to a metrology target on a sample at one or more selected incidence angles, wherein the sample is formed from a first wafer and a second wafer bonded to the first wafer at an interface, wherein the metrology target is located at the interface, wherein the illumination from the one or more illumination sources propagates through the first wafer to reach the metrology target;
        a detector;
        one or more collection optics configured to collect light from the sample, wherein the light collected from the sample includes light from the metrology target and light from a top surface of the first wafer, wherein the one or more collection optics is configured to direct the light from the metrology target to the detector; and
    a controller communicatively coupled to the detector, wherein the controller includes one or more processors configured to execute program instructions causing the one or more processors to generate estimates of one or more parameters associated with the sample based on data received from the detector.

2. The metrology system of claim 1, wherein the one or more illumination optics are further configured to direct the illumination from the illumination source to the metrology target at one or more selected azimuth angles.

3. The metrology system of claim 2, wherein the one or more selected azimuth angles include azimuth angles ranging from 0 degrees to 360 degrees.

4. The metrology system of claim 1, wherein generating estimates of one or more parameters associated with the sample based on the data received from the detector comprises:
    generating an estimate of an overlay error indicative of alignment of the first wafer with respect to the second wafer based on the reflected light from the metrology target.

5. The metrology system of claim 4, wherein the generating an estimate of an overlay error indicative of alignment of the first wafer with respect to the second wafer based on the reflected light from the metrology target comprises:
    generating an estimate of an overlay error indicative of alignment of the first wafer with respect to the second wafer based on the reflected light from the metrology target using a rigorous coupled-wave analysis technique based on the reflected light from the metrology target.

6. The metrology system of claim 4, wherein the generating an estimate of an overlay error indicative of alignment of the first wafer with respect to the second wafer based on the reflected light from the metrology target comprises:
generating an estimate of an overlay error indicative of alignment of the first wafer with respect to the second wafer based on the reflected light from the metrology target using a machine learning technique based on the reflected light from the metrology target.

7. The metrology system of claim 1, wherein the illumination from at least one of the one or more illumination sources comprises:
wavelengths ranging from 750 nanometers to 2,800 nanometers.

8. The metrology system of claim 1, wherein the illumination from at least one of the one or more illumination sources comprises:
wavelengths ranging from 150 nanometers to 300 nanometers.

9. The metrology system of claim 1, wherein the illumination from at least one of the one or more illumination sources comprises:
wavelengths ranging from 190 nanometers to 900 nanometers.

10. The metrology system of claim 1, wherein the metrology tool comprises:
a spectroscopic ellipsometer.

11. The metrology system of claim 10, wherein the one or more selected incidence angles are greater than 35 degrees.

12. The metrology system of claim 1, wherein the metrology tool comprises:
a spectroscopic reflectometer.

13. The metrology system of claim 12, wherein the one or more selected incidence angles are in a range of 5 degrees to 40 degrees.

14. The metrology system of claim 12, further comprising:
an objective lens, wherein the one or more illumination optics direct the illumination from the one or more illumination sources to the metrology target through the objective lens, wherein the one or more collection optics collect the light from the sample through the objective lens.

15. The metrology system of claim 1, wherein the one or more collection optics include one or more elements to isolate the light from the metrology target from the light reflected from the top surface of the first wafer.

16. The metrology system of claim 15, wherein the one or more collection optics include at least one of a field stop or a beam block to block the light from the top surface of the first wafer and pass the light from the metrology target.

17. The metrology system of claim 15, wherein the one or more collection optics include at least one optical element having a non-zero optical power to selectively direct the light reflected from the metrology target to the detector.

18. The metrology system of claim 1, wherein the one or more processors are further configured to execute program instructions causing the one or more processors to isolate the light from the metrology target from the light from the top surface of the first wafer based on one or more known characteristics of at least one of the light from the metrology target or the light from the top surface of the first wafer.

19. The metrology system of claim 18, wherein the one or more known characteristics of at least one of the light from the metrology target or the light from the top surface of the first wafer are based on at least one of a wavelength of the illumination from the one or more illumination sources, an incident angle of the illumination from the one or more illumination sources on the metrology target, an azimuth angle of the illumination from the one or more illumination sources on the metrology target, a transmissivity of the first wafer, or a thickness of the first wafer, or a design of the metrology target.

20. The metrology system of claim 1, wherein the one or more illumination sources comprise:
one or more lasers providing one or more narrow-band spectra.

21. The metrology system of claim 20, wherein the one or more illumination optics and the one or more collection optics form at least one of a narrow-band ellipsometer or a narrow-band reflectometer.

22. The metrology system of claim 1, wherein the illumination from the one or more illumination sources includes a broad-band spectrum.

23. The metrology system of claim 22, wherein the one or more collection optics include a dispersive element to provide a selected spatial distribution of wavelengths of the broad-band spectrum across the detector, wherein the detector includes one or more sensors oriented along the spatial distribution of wavelengths, wherein each of the one or more sensors has a selected sensitivity to a range of incident wavelengths based on the selected spatial distribution of wavelengths.

24. The metrology system of claim 23, wherein the detector includes a single sensor having calibrated sensitivity across the selected spatial distribution of wavelengths.

25. The metrology system of claim 23, wherein the detector includes two or more sensors having calibrated sensitivities across the selected spatial distribution of wavelengths.

26. A metrology method comprising:
illuminating a metrology target on a sample with illumination from one or more illumination sources at one or more selected incidence angles, wherein the sample is formed from a first wafer and a second wafer bonded to the first wafer at an interface, wherein the metrology target is located at the interface, wherein the illumination from the one or more illumination sources propagates through the first wafer to reach the metrology target;
collecting light from the sample in response to the illumination from the one or more illumination sources, wherein the light collected from the sample includes light from the metrology target and light from a top surface of the first wafer, wherein the light from the metrology target is directed to a detector; and
generating, with one or more processors, estimates of one or more parameters associated with the sample based on data received from the detector.

27. The metrology method of claim 26, further comprising:
illuminating the metrology target on the sample with the illumination from the one or more illumination sources at one or more selected azimuth angles.

28. The metrology method of claim 26, wherein the one or more parameters associated with the sample include an overlay error between the first wafer and the second wafer.

29. The metrology method of claim 26, further comprising:
isolating the light from the metrology target from the light from the top surface of the first wafer.

30. The metrology method of claim 29, wherein isolating the light from the metrology target from light reflected from the top surface of the first wafer comprises:
selectively directing the light reflected from the metrology target to the detector using at least one of a cylindrical optical element or an aspherical optical element.

31. The metrology method of claim 29, wherein isolating the light from the metrology target from the light reflected from the top surface of the first wafer comprises:
blocking the light from the top surface of the first wafer and passing the light from the metrology target.

32. The metrology method of claim 29, wherein isolating the light from the metrology target from the light reflected from the top surface of the first wafer comprises:
isolating, with the one or more processors, the light from the metrology target from the light from the top surface of the first wafer based on one or more known characteristics of at least one of the light from the metrology target or the light from the top surface of the first wafer.

33. The metrology method of claim 32, wherein the one or more known characteristics of at least one of the light from the metrology target or the light from the top surface of the first wafer are based on at least one of a wavelength of the illumination from the one or more illumination sources, an incident of the illumination from the one or more illumination sources on the metrology target, a transmissivity of the first wafer, or a thickness of the first wafer, or a design of the metrology target.

34. A metrology system comprising:
one or more illumination sources;
one or more detectors;
an ellipsometer configured to direct, with one or more ellipsometer illumination optics, illumination from the one or more illumination sources to a metrology target on a sample at a first set of one or more selected incidence angles, wherein the sample is formed from a first wafer and a second wafer bonded to the first wafer at an interface, wherein the metrology target is located at the interface, wherein the illumination from the one or more illumination sources propagates through the first wafer to reach the metrology target, wherein the ellipsometer is further configured to direct, with one or more ellipsometer collection optics, light reflected from the metrology target to at least one of the one or more detectors to generate ellipsometry signals;
a reflectometer configured to direct, with one or more reflectometer illumination optics, the illumination from the one or more illumination sources to the metrology target at a second set of one or more selected incidence angles, the reflectometer further configured to direct, with one or more reflectometer collection optics, the light reflected from the metrology target to at least one of the one or more detectors to generate reflectometry signals; and
a controller communicatively coupled to the ellipsometer and the reflectometer, the controller including one or more processors configured to execute program instructions causing the one or more processors to generate estimates of one or more parameters associated with the sample based on the ellipsometry signals and the reflectometry signals.

35. The metrology system of claim 34, wherein the ellipsometry signals and the reflectometry signals are collected simultaneously.

36. The metrology system of claim 34, wherein the ellipsometry signals and the reflectometry signals are collected sequentially.

37. The metrology system of claim 34, wherein the ellipsometer and the reflectometer direct the illumination from the one or more illumination sources to collocated portions of the sample.

38. The metrology system of claim 34, wherein the ellipsometer and the reflectometer direct the illumination from the one or more illumination sources to different portions of the sample.

39. The metrology system of claim 34, wherein the one or more parameters associated with the sample include an overlay error between the first wafer and the second wafer.

* * * * *